United States Patent [19]
Manabe et al.

[11] Patent Number: 5,122,845
[45] Date of Patent: Jun. 16, 1992

[54] SUBSTRATE FOR GROWING GALLIUM NITRIDE COMPOUND-SEMICONDUCTOR DEVICE AND LIGHT EMITTING DIODE

[75] Inventors: Katsuhide Manabe, Ichinomiya; Hisaki Kato, Komaki; Isamu Akasaki, Machida; Kazumasa Hiramatsu, Yokkaichi; Hiroshi Amano, Hamamatsu, all of Japan

[73] Assignees: Toyoda Gosei Co., Ltd., Nagoya; Nagoya University and Research Development Corporation of Japan, Tokyo, both of Japan

[21] Appl. No.: 484,213

[22] Filed: Feb. 26, 1990

[30] Foreign Application Priority Data

Mar. 1, 1989 [JP] Japan ................... 1-50458

[51] Int. Cl.⁵ .......................... H01L 33/00
[52] U.S. Cl. ...................... 357/17; 357/61; 252/623 GA
[58] Field of Search ........... 357/61, 60, 17, 16; 252/623 GA; 437/133, 905, 976; 148/DIG. 13

[56] References Cited
U.S. PATENT DOCUMENTS 4,614,961 9/1986 Khan et al. ............. 357/61 X
4,616,248 10/1986 Khan et al. ............. 357/4 X Primary Examiner—Andrew J. James
Assistant Examiner—Sara W. Crane
Attorney, Agent, or Firm—Cushman, Darby & Cushman

[57] ABSTRACT

A substrate for producing a gallium nitride compound-semiconductor ($Al_xGa_{1-x}N$; $X=0$ inclusive) device in vapor phase on a sapphire substrate using gaseous organometallic compound, and a also blue light emitting diode produced by using the substrate. The buffer layer comprising aluminium nitride (AlN) and having a crystal structure where microcrystal or polycrystal is mixed in amorphous state, is formed on the sapphire substrate. The buffer layer is formed at a growth temperature of 380° to 800° C. to have a thickness of 100 to 500 Å. Further, on the buffer layer is formed the layer of gallium nitride compound-semiconductor ($Al_xGa_{1-x}N$; $X=0$ inclusive). The layer of gallium nitride compound-semiconductor ($Al_xGa_{1-x}N$; $X=0$ inclusive) comprising at least two layers having different conductive types and being sequentially layered on the buffer layer, functions as a light emitting layer. The existence of the buffer layer having the aforementioned structure greatly contributes on the improved high-quality single crystal of the gallium nitride compound-semiconductor. On the other hand, the blue light emitting property is also improved due to the increase of the quality.

10 Claims, 12 Drawing Sheets

RHEED PATTERN OF AℓN
GROWTH CONDITION OF AℓN
300Å, 650°C

RHEED PATTERN OF AℓN
GROWTH CONDITION OF AℓN
650 °C, 50Å

RHEED PATTERN OF AℓN
GROWTH CONDITION OF AℓN
650 °C, 1000Å

SEM IMAGE OF GaN
GROWTH CONDITION OF AℓN
650°C, 50Å

SEM IMAGE OF GaN
GROWTH CONDITION AℓN
650°C, 1000Å

RHEED PATTERN OF GaN
GROWTH CONDITION OF AℓN
650°C, 50Å

RHEED PATTERN OF GaN
GROWTH CONDITION OF AℓN
650°C, 1000Å

RHEED PATTERN OF AℓN
GROWTH CONDITION OF AℓN
300°C, 300Å

RHEED PATTERN OF AℓN
GROWTH CONDITION OF AℓN
1000°C, 300Å

×3700

SEM IMAGE OF GaN
GROWTH CONDITION OF AℓN
350°C, 300Å

×3700

SEM IMAGE OF GaN
GROWTH CONDITION OF AℓN
1000°C, 300Å

RHEED PATTERN OF GaN
GROWTH CONDITION OF AℓN
350°C, 300Å

RHEED PATTERN OF GaN
GROWTH CONDITION OF AℓN
1000°C, 300Å

RHEED PATTERN OF AℓN
GROWTH CONDITION OF AℓN
500°C, 350Å

×8500

SEM IMAGE OF GaN
GROWTH CONDITION OF AℓN
500°C, 350Å

SUBSTRATE FOR GROWING GALLIUM NITRIDE COMPOUND-SEMICONDUCTOR DEVICE AND LIGHT EMITTING DIODE

BACKGROUND OF THE INVENTION

This invention relates to a substrate for producing a gallium nitride compound-semiconductor device and the structure of a light emitting diode.

There has been conventionally investigated process for growing a layer of gallium nitride compound-semiconductor($Al_xGa_{1-x}N$; $X=0$ inclusive) in vapor phase on a sapphire substrate using metalorganic vapor phase epitaxy (hereinafter referred to as MOVPE) and also a light emitting diode using the layer of gallium nitride compound-semiconductor as a light emitting layer.

Because a single crystal wafer of gallium nitride compound-semiconductor cannot be readily obtained, gallium nitride compound-semiconductor is epitaxially grown on the sapphire substrate having a lattice constant close to that of the gallium nitride compound-semiconductor.

There has been a problem that a high-quality gallium nitride compound-semiconductor crystal has not been obtained due to lattice mismatching between sapphire and gallium nitride compound-semiconductor as a light emitting layer and to the vast difference in vapor pressure between gallium and nitrogen. Therefore, the light emitting diode proposing highly efficient blue light emission has not yet been obtained.

A process for growing gallium nitride compound-semiconductor on a sapphire substrate is disclosed by one of the inventors of the present invention in U.S. Pat. No. 4,855,249.

SUMMARY OF THE INVENTION

Accordingly, this invention is made to solve the problem described above. The first object of the present invention is to grow a high-quality single crystalline gallium nitride compound-semiconductor having fewer lattice defects on a sapphire substrate.

The second object of the present invention is to provide a light emitting diode in which blue light is a high-efficiency emitting light, by growing a high-quality single crystalline gallium nitride compound-semiconductor on the sapphire substrate.

The first characteristic feature of the present invention is described as a substrate for growing a layer of gallium nitride compound-semiconductor ($Al_xGa_{1-x}N$; $X=0$ inclusive) in vapor phase on the sapphire substrate using gaseous organometallic compound. On the sapphire substrate is arranged a buffer layer comprising aluminium nitride (AlN) having a crystal structure that microcrystal or polycrystal is mixed in amorphous state. The buffer layer is formed into a layer having a thickness in the range of 100 to 500Å, provided that the growth temperature is in the range of 380° to 800° C. Subsequently, the layer of gallium nitride compound-semiconductor ($Al_xGa_{1-x}N$; $X=0$ inclusive) is made to grow on the buffer layer.

The second characteristic feature of the present invention is described as a light emitting diode comprising a sapphire substrate, a buffer layer and layers of gallium nitride compound-semiconductor ($Al_xGa_{1-x}N$; $X=0$ inclusive) comprising at least two light emitting layers on the buffer layer, each layer having different conductive types from each other. On the sapphire substrate is arranged the buffer layer comprising aluminium nitride (AlN) having a crystal structure that microcrystal or polycrystal is mixed in amorphous state. The buffer layer is formed into a layer having a thickness in the range of 100 to 500Å, provided that the growth temperature is in the range of 380° to 800° C. Then, on the buffer layer is layered the layer of gallium nitride compound-semiconductor ($Al_xGa_{1-x}N$; $X=0$ inclusive) as a light emitting layer.

The buffer layer, comprising aluminium nitride (AlN), having a thickness in the range of 100 to 500Å and having a crystal structure that microcrystal or polycrystal is mixed in amorphous state, is formed on the sapphire substrate.

The lattice defects of the layer of gallium nitride compound-semiconductor growing on the buffer layer has been decreased. Also, the light emitting diode of the present invention has been improved of its blue-light emitting property due to the improved crystalline quality of the layer of gallium nitride compound-semiconductor as a light emitting layer.

DESCRIPTION OF THE INVENTION

Firstly, the production system for practicing the present invention is explained.

Figure 1:
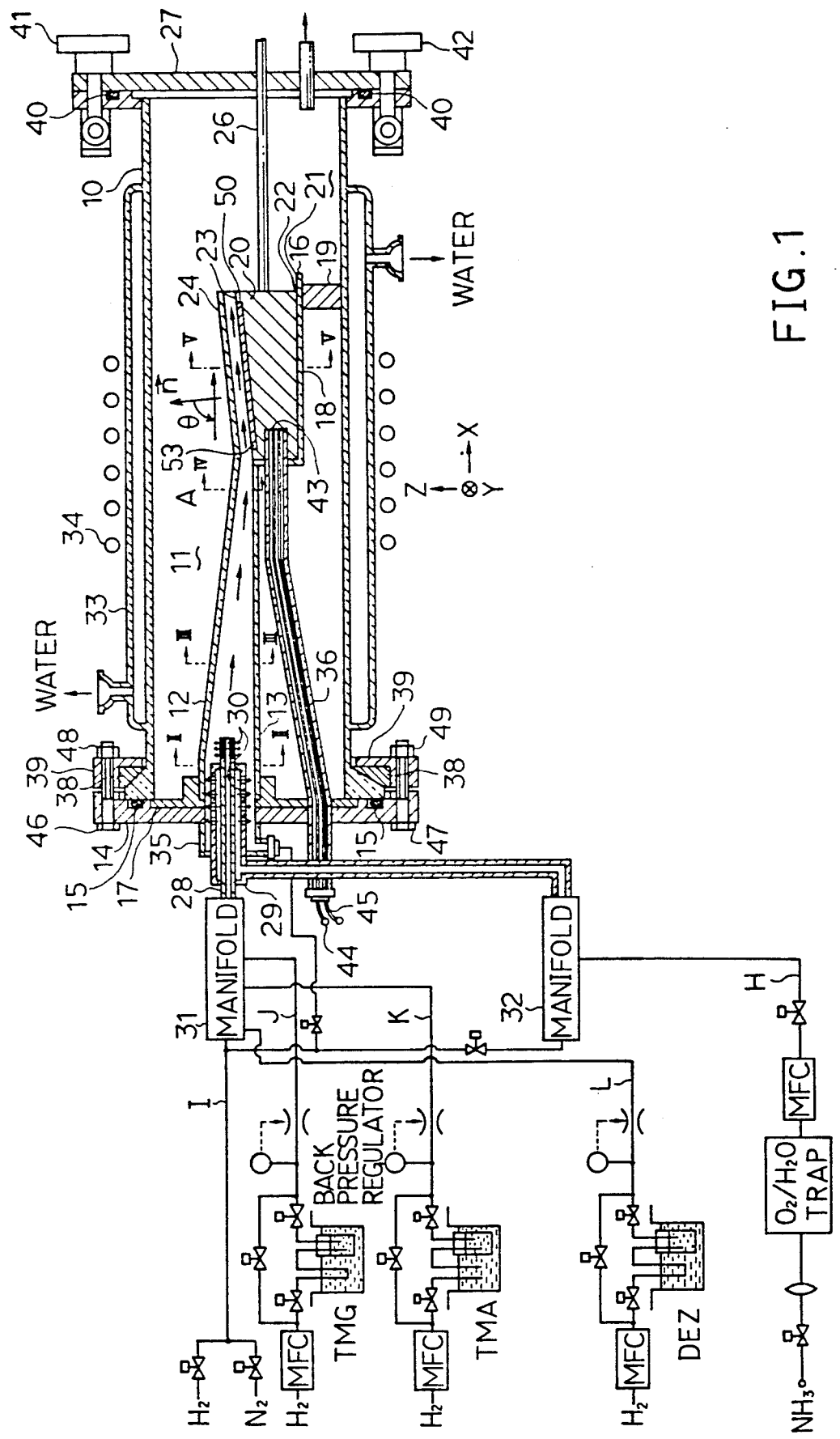
FIG. 1 is a block diagram demonstrating a vapor phase growing system used in practicing the present invention.
Figure 4:
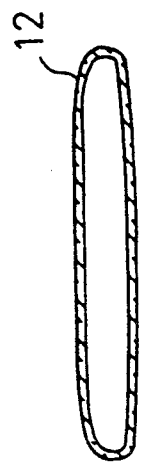
FIGS. 2, 3, 4 and 5 are cross-sectional views of the liner pipe of the system.
Figure 3:
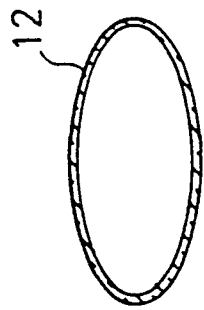
Figure 5:
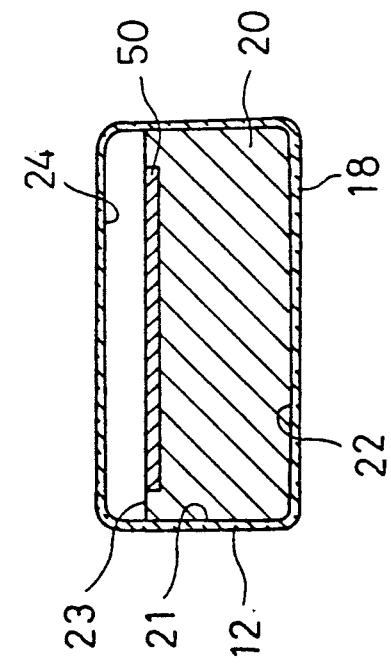
Figure 2:
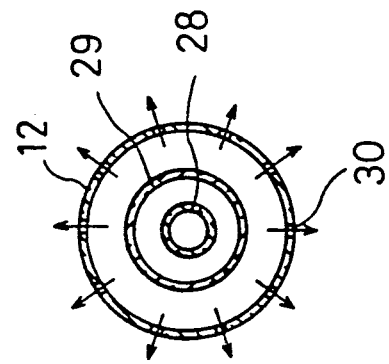

In FIG. 1, a silica tube 10 is sealed at its left end with an O-type ring 15 to contact to and be fixed at a flange 14 at a number of points thereof with bolts 46, 47 and nuts 48, 49, using a bushing material 38 and a fixture 39. Also, the right end of the silica tube 10, after sealing with an O-type ring 40, is fixed at a flange 27 with thread-fastening fixtures 41, 42.

In an inner compartment 11 enclosed by the silica tube 10, a liner pipe 12 introducing reaction gas is arranged. One end 13 of the liner pipe 12 is retained by a retaining plate 17 fixed to the flange 14, while the bottom 18 of the other end 16 thereof is retained on the silica tube 10 by a retaining foot 19.

The cross section, vertical to X-axis direction of the silica tube 10, of the liner pipe 12 shows different aspects by the position thereof on X-axis direction, as shown in FIGS. 2 to 5. Namely, the cross section of the liner pipe 12 is in circular shape at upstream side of reaction gas flow. The cross section of the liner pipe 12 takes ellipse shape, with its longer axis being vertical to the present paper face of FIG. 1(Y-axis direction) as it proceeds downstream (positive X-axis direction). The ellipse shape is enlarged toward the longer axis direction, being reduced toward the shorter axis direction as it proceeds downstream, to result in a larger degree of deviation. The cross section of the liner pipe 12 is in deviated ellipse shape, but at a little upstream point A placing a susceptor 20, it gets shorter in the up and down direction (Z-axis) and longer in Y-axis direction. In the cross-sectional view at IV—IV line of point A, the length of the aperture along Y-axis direction is 7.0 cm and the length along Z-axis direction is 1.2 cm.

A sample loading compartment 21, placing the susceptor 20 and in rectangular shape as the cross sectional form vertical to X-axis, is integrally connected to the downstream side of the liner pipe 12. The susceptor 20 is placed at the bottom 22 of the sample placing compartment 21. The cross section vertical to X-axis of the susceptor 20 is in rectangular shape, but the upper face 23 thereof slopes toward the positive Z-axis direction, while gradually leaning toward X-axis. A sample i.e. a sapphire substrate 50 in rectangular shape is placed on the upper face 23 of the susceptor 20 and the clearance between the sapphire substrate 50 and the upper pipe wall 24 of the liner pipe 12 is 12 mm long on the upstream side and 4 mm long on the downstream side.

The upper face 23 of the susceptor 20 is inclined so as to make the angle $\theta$ 83° between the normal vector n of the surface 23 and -X-axis direction. Because the direction of gas flow at the position A near the inlet side 53 of the sapphire substrate 50 is parallel to the X-axis, the angle $\theta$ is equal to an incident angle of reaction gas to the sappire substrate 50 at the inlet side 53.

An unturbulent gas flow can be got on the sapphire substrate 50 to grow a high-quality crystal with the device of the above construction. It is preferable to get a good unturbulent flow that the incident angle $\theta$ of the reaction gas at the inlet side 53 of the substrate 50 is between 90° and 75°. It is more preferable that the incident angle $\theta$ is between 85° and 80°.

A controlling bar 26 is connected to the susceptor 20. After removing the flange 27, the susceptor 20 placing the sapphire substrate 50 can be put in the sample loading compartment 21 or can be taken out from the sample loading compartment 21 after completion of crystal growth, by using the controlling bar 26.

A first gas pipe 28 opens on the upstream side of the liner pipe 12, while a second gas pipe 29 is sealed at its end in a state of covering the first gas pipe 28. Both pipes 28 and 29 are made into coaxial double-pipe structure. The projecting part of the first gas pipe 28 from the second gas pipe 29, and the peripheral part of the second gas pipe 29 have a large number of holes 30, through which two kinds of the reaction gas introduced through the first gas pipe 28 and the second gas pipe 29, individually, blow down into the inside of the liner pipe 12 where both of the reaction gas are mixed with each other for the first time.

The first gas pipe 28 is connected to a first manifold 31 and the second gas pipe 29 is connected to a second manifold 32. Furthermore, a carrier gas-supplying system I, a trimethylgallium (referred to as TMG)-supplying system J, a trimethylaluminium (referred to as TMA)-supplying system K and a diethylzinc (referred to as DEZ)-supplying system L are connected to the first manifold 31, while the carrier gas-supplying system I and a NH$_3$-supplying system H are connected to the second manifold 32.

Additionally, a cooling tube 33 for circulating cooling water is formed at the peripheral portion of the silica tube 10, and a high-frequency coil 34 to generate a high-frequency electric field in the inner compartment 11 is also arranged on the peripheral portion thereof.

The liner pipe 12 is connected through the flange 14 to an external pipe 35, and the carrier gas is introduced through the external pipe 35. An introduction pipe 36 extends from the external side through the flange 14 into the side of the sample loading compartment 21, and thermoelectric couple 43 and its wires 44, 45 are arranged inside of the introduction pipe 36 to measure the sample temperature, in order to propose the means to measure the sample temperature externally.

Such system constitution enables to mix a mixed gas comprising TMG, TMA, H$_2$ and DEZ-H$_2$, which is introduced through the first gas pipe 28, with a NH$_3$ and H$_2$ mixed gas, introduced through the second gas pipe 29, near the discharge exits of these pipes. The mixed reaction gas is introduced to the sample loading compartment 21 through the liner pipe 12 and passes through the clearance formed between the sapphire substrate 50 and the upper pipe wall 24 of the liner pipe 12. Then, the flow of the reaction gas on the sapphire substrate 50 gets constant and uniformity, so that high-quality crystal with less position-dependency may grow.

For forming the layer of N-type Al$_x$Ga$_{1-x}$N, the mixed gas is made to flow from the first gas pipe 28 and the second gas pipe 29 with stopping DEZ-H$_2$ gas flow. For forming the layer of I-type Al$_x$Ga$_{1-x}$N, each of the mixed gas is made to flow from the first gas pipe 28 and the second gas pipe 29 with flowing DEZ-H$_2$ gas. In case of forming the layer of I-type Al$_x$Ga$_{1-x}$N, DEZ is made to blow down on the sapphire substrate 50 and is decomposed by heat, so that the growing Al$_x$Ga$_{1-x}$N may be doped with the dopant element to produce I-type Al$_x$Ga$_{1-x}$N.

Subsequently, the crystal growth was carried out on the sapphire, substrate 50 as follows, by using the present system.

First of all, the single crystal sapphire substrate 50 having the principal surface oriented to the direction {0001}, after organic cleaning and heat treatment, is fixed to the susceptor 20. Then, while flowing H$_2$ at 0.3 l/min through the first gas pipe 28, the second gas pipe 29 and the external pipe 35 into the liner pipe 12 the sapphire substrate 50 was subjected to vapor phase etching at a temperature of 1100° C. Then, the temperature being lowered to 650° C., H$_2$, NH$_3$ and TMA at 15° C. were supplied at 3 l/min, 2 l/min and 50 cc/min for two minutes.

Figure 6:
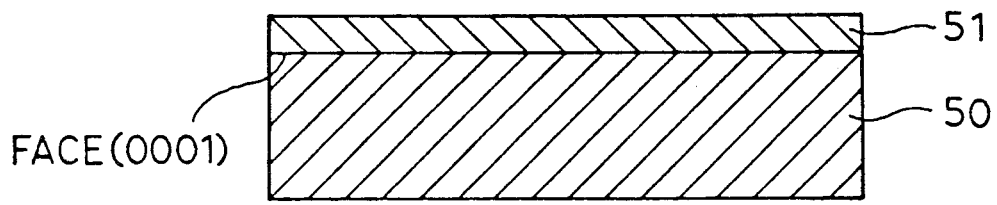
FIG. 6 is a cross-sectional view demonstrating the constitution of the substrate on wich crystal grows.
Figure 9:
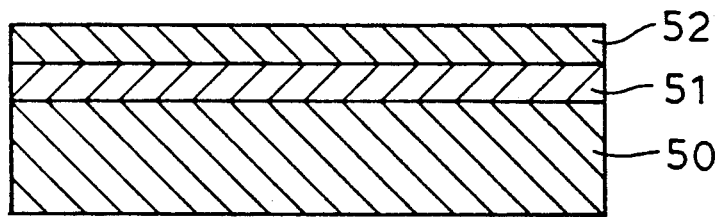
FIG. 9 is a cross-sectional view of the semiconductor structure after N-type GaN layer grows.
Figure 7:
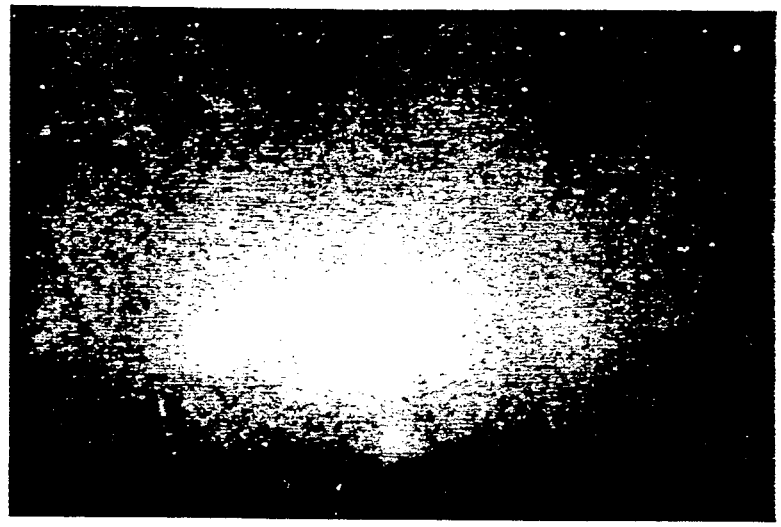
FIG. 7 is an RHEED pattern showing the crystal structure of the buffer layer comprising AlN.

The buffer layer 51 comprising AlN was formed at a thickness of about 300Å through this growth process as shown in FIG. 6. An RHEED pattern of the buffer layer 51 was determined. The result is shown in FIG. 7. The RHEED pattern shown in FIG. 7 indicates the pattern mixed with a lattice pattern and a halo pattern. The lattice pattern shows the crystal structure is single. On the other hand, the halo pattern shows it is amorphous. Accordingly the crystal structure of the layer is composed of a mixture of polycrystalline, microcrystalline and amorphous state.

Figure 8A:
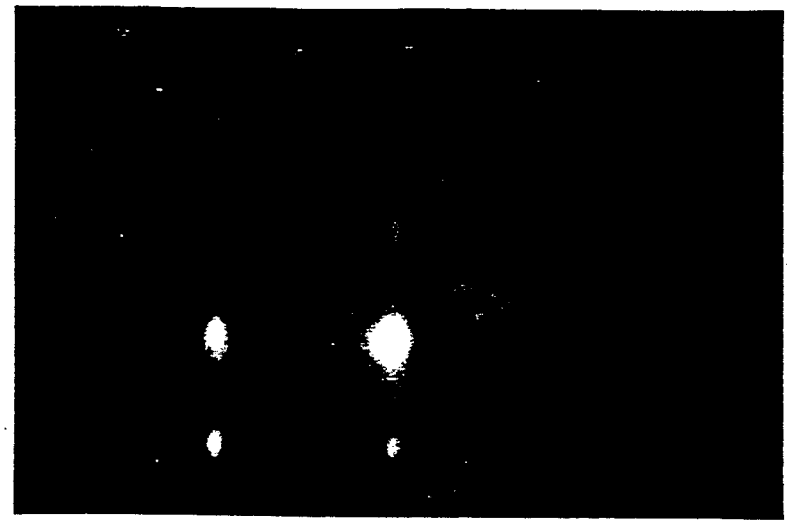
FIGS. 8A and 8B are RHEED patterns showing the crystal structure of the buffer layer comprising AlN, while the thickness of the buffer layer changes.
Figure 8B:
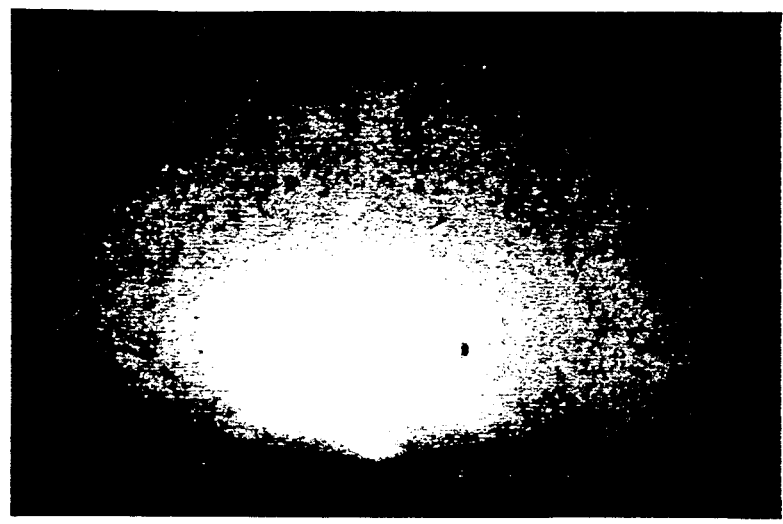

By using the above system, a variety of buffer layers comprising AlN were formed on other sapphire substrates at a growth temperature of 650° C., while the thickness varied in the range of 50 to 1000Å. RHEED patterns on the surface thereof were then determined. The results are shown in FIGS. 8A and 8B. The photographs show that the thickness of 100Å or less is likely to produced single crystal while the thickness of 500Å or more is likely to produce polycrystal.

Figure 10A:
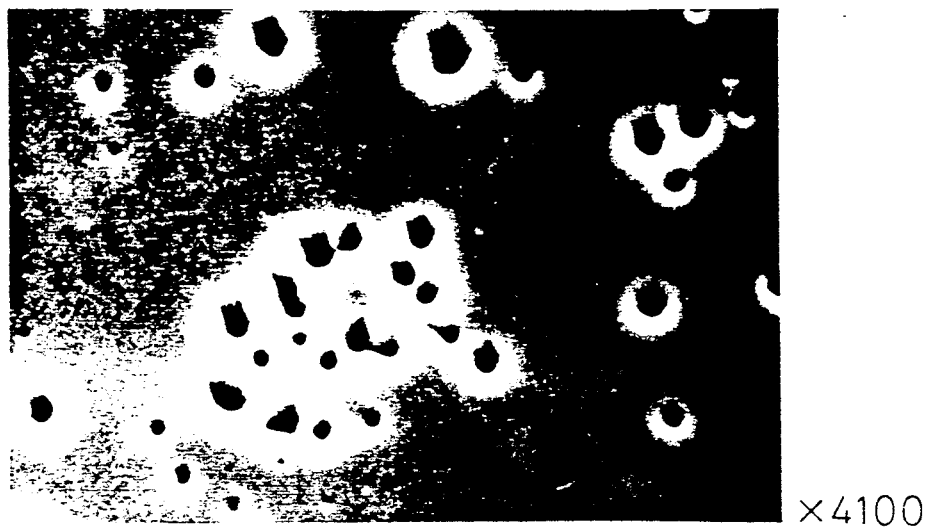
FIGS. 10A and 10B are SEM images showing the crystal structure of the GaN layer grown on the buffer layer while the thickness of the buffer layer comprising AlN changes.
Figure 10B:
Figure 11A:
FIGS. 11A and 11B are RHEED patterns showing the crystal structure of the GaN layer grown on the buffer layer while the thickness of the buffer layer comprising AlN changes.
Figure 11B:
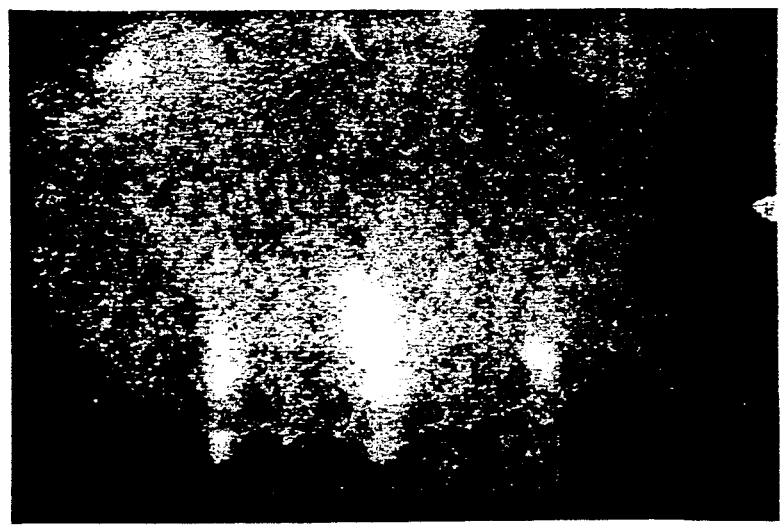

Various samples for the buffer layers comprising Al N having a thickness in the range of 50 to 1000Å were kept at a temperature of 970° C. under the flow of H$_2$, NH$_3$ and TMG at −15° C. at 2.5 l/min, 1.5 l/min and 100 cc/min, respectively, through the first and the second gas pipes 28, 29 for 60 minutes, to form the N layer 52 composed of N-type GaN having a thickness of about 7 μm. Thus, SEM images and RHEED patterns of the N layer 52 were determined. The results are shown in FIGS. 10A, 10B, 11A and 11B. The magnification of the SEM images shown in FIGS. 10A and 10B is ×4100. The buffer layer 51 having a thickness of 100Å or less produces an N layer 52 with some pits, while the buffer layer 51 having a thickness of 500Å or more causes a similar state in the N layer as those observed in case of the thickness of 100Å or less.

Figure 12A:
FIGS. 12A and 12B are RHEED patterns showing the crystal structure of the buffer layer comprising AlN while the growth temperature changes.
Figure 12B:
Figure 13A:
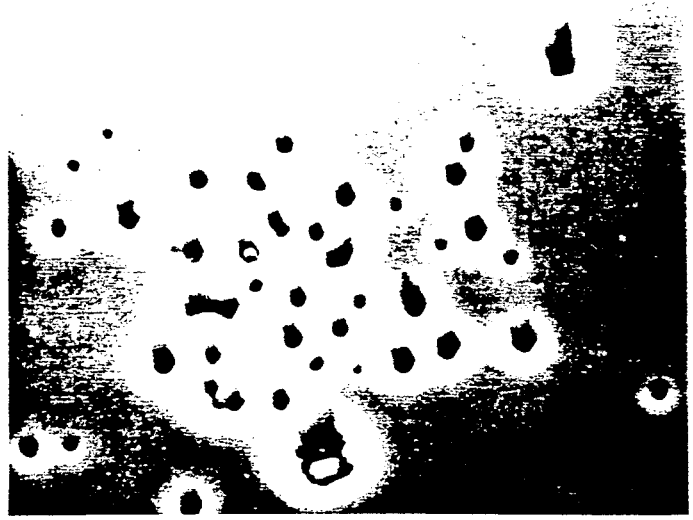
FIGS. 13A and 13B are SEM images showing the crystal structure of the GaN layers grown on a variety of AlN buffer layers while the growth temperature of the buffer layers changes.
Figure 13B:
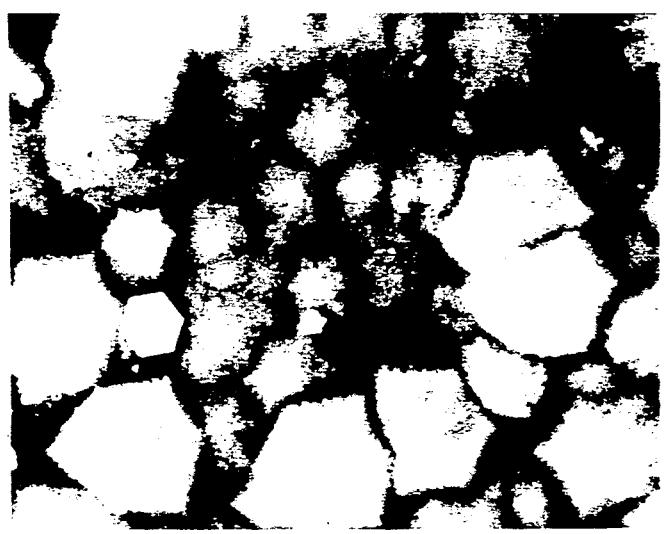
Figure 14A:
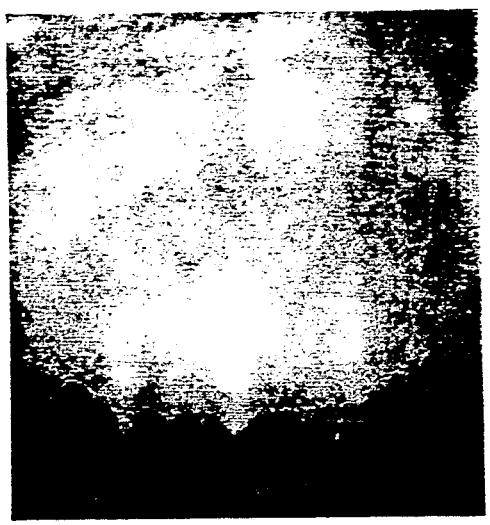
FIGS. 14A and 14B are RHEED patterns showing the crystal structure of the GaN layers grown on a variety of AlN buffer layers while the growth temperature of the buffer layers changes.
Figure 14B:
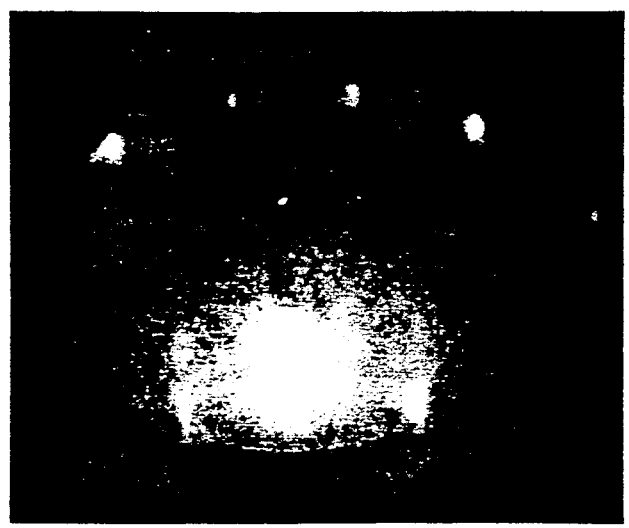

Accordingly, the thickness of the buffer layer 51 comprising AlN may preferably be in the range of 100 to 500Å, in order to produced a good crystalline N layer. As other samples, a variety of buffer layers comprising AlN having a 300Å thickness were grown on the sapphire substrate 50 while the growth temperature was made to change in the range of 300° to 1200° C. Then, RHEED patterns of the buffer layers comprising AlN were determined similarly. The results are shown in FIGS. 12A and 12B. These figures indicate that an AlN buffer layer having a desired thickness may not be obtained when the growth temperature is 380° C. or less, and a desired layer property may not be obtained because of the growth of a single crystal when the growth temperature is 800° C. or more, either.

Figure 15A:
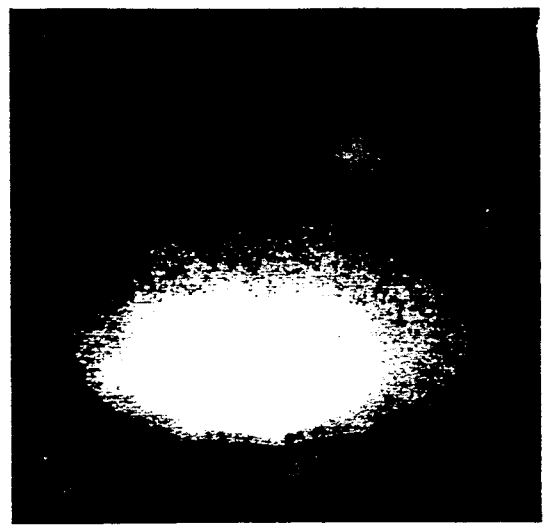
FIG. 15A is an RHEED pattern showing the crystal structure of the AlN buffer layer grown at 500° C. and in a thickness of 350Å.

A buffer layer comprising AlN having a 350Å thickness was grown on the sapphire substrate 50 at the growth temperature of 500° C. Then, a RHEED pattern of the buffer layer comprising AlN was determined similarly. The result is shown in FIG. 15A. This figure indicates that a lattice pattern and a halo pattern are mixed. The lattic pattern indicates that the AlN buffer layer is single crystalline. The halo pattern indicates that the AlN buffer layer is amorphous. Accordingly it is known from the fact described above that the AlN buffer layer corresponding to FIG. 15A has the crystalline structure mixed with a polycrystalline, microcrystalline and amorphous state.

Figure 15B:
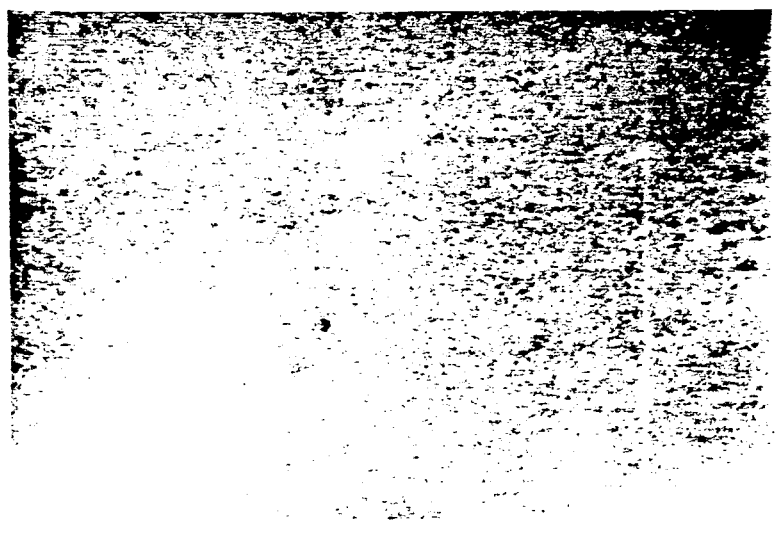
FIG. 15B is a SEM image showing the crystal structure of the GaN layers grown on the AlN buffer layer which is grown at 500° C. and in a thickness of 350Å.

Furthermore, the same process was applied to grow the N layer composed of N-type GaN having a thickness of about 7 μm on a variety of samples which were obtained by growing the above AlN buffer layers having a 300Å and a 350Å thickness at a growth temperature in the range of 300° to 1200° C. Then, SEM images and RHEED patterns were determined. The results are shown in FIGS. 13A and 13B, FIGS. 14A and 14B, and FIG. 15B. The magnification of the SEM images shown in FIGS. 10A and B is ×3700, and the magnification of the SEM images shown in FIG. 15B is ×8500. The N layer composed of N-type GaN has crystal with some pits, when produced at a temperature below 380° C.; when the AlN buffer layer grows at a temperature above 800° C., the produced crystal of the N layer is hexagon morphologically. These results indicate that the temperature for growing the AlN buffer layer may preferably be in the range of 380° to 800° C. in order to produce a good crystalline N layer with fewer lattice defects.

These experiments described above indicate that the single crystalline quality of GaN layer growing on the AlN buffer layer improves when the AlN buffer layer comprises polycrystal or microcrystal mixed in an amorphous state. Additionally, it was found that preferably, the content ratio of the polycrystal or microcrystal might be 1 to 90% and that the size thereof might be 0.1 μm or less. The formation of the Al N buffer layer having such crystal structure was carried out at reaction gas flow in the range of 0.1 to 1000 cc/min for TMA at 15° C., 100 cc to 10 l/min for NH$_3$ and 1 to 50 l/min for H$_2$ in addition to the above described condition i.e. such thickness and growth temperature.

The process of producing light emitting diode is explained hereinafter.

Figure 16:
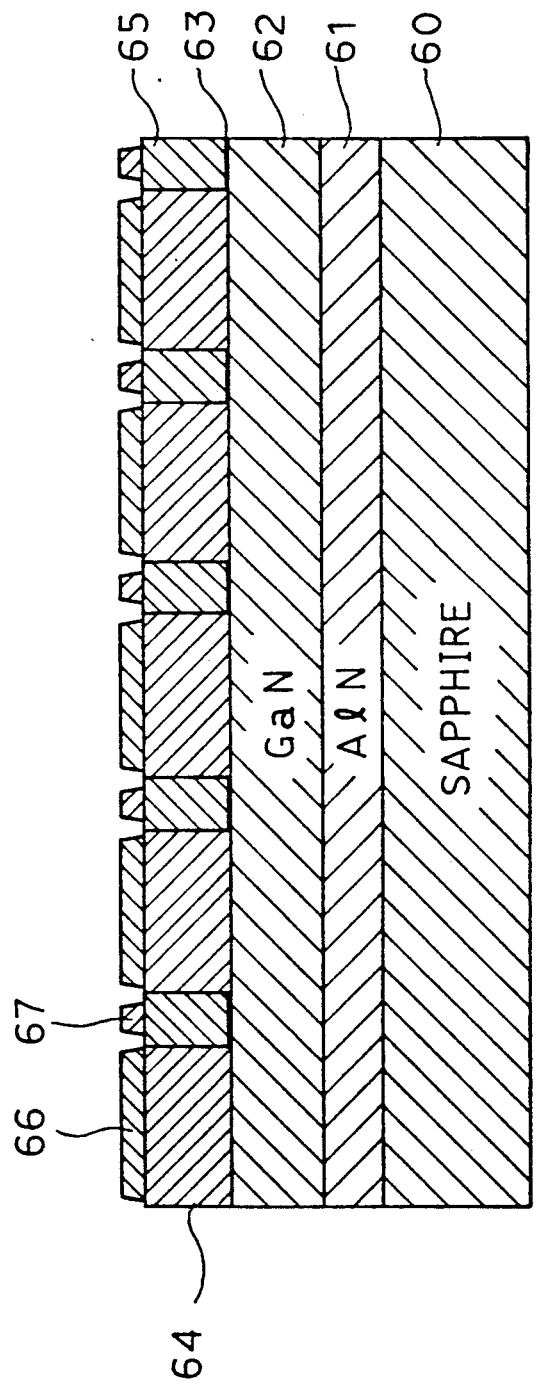
FIG. 16 is a cross-sectional view demonstrating the structure of a wafer on wich light emitting diodes are constructed.

The crystal growth on sapphire substrate 60 was carried out to produce the constitution as shown in FIG. 16, by using the present system.

Similarly as aforementioned, H$_2$, NH$_3$ and TMA at 15° C. were supplied on the single crystal sapphire substrate 60 at 3 l/min, 2 l/min and 500 cc/min, respectively, for one minute when the growth temperature was set at 650° C., to produce the AlN buffer layer of 350Å. One minute later, the supply of TMA was eased to keep the sapphire substrate 60 at a temperature of 970° C. and then, an N layer 62 comprising N-type GaN of a thickness of about 7 μm was formed under the supply of H$_2$, NH$_3$ and TMG at −15° C. at 2.5 l/min, 1.5 l/min and 100 cc/min, respectively, for 60 min. The sapphire substrate 60 on which the N-layer 62 was formed, was taken out from the vapor phase growing system and then, a photoresist was applied to the main face of the N layer 62 before exposure using a mask of a predetermined pattern. Subsequently, etching was carried out to obtain a photoresist having the predetermined pattern. Then, with the use of the photoresist as a mask, a SiO$_2$ layer 63 having a thickness of about 100Å was formed. After the photoresist was removed, the sapphire substrate 60 having the SiO$_2$ layer 63 as a single layer in pattern formation was washed before proposing again the layer arranged appropriately on the susceptor 20 to vapor phase etching. And then, the sapphire substrate 60 was kept at a temperature of 970° C. under the supply of H$_2$, NH$_3$, TMG at −15° C. and DEZ at 30°

C., at 2.5 l/min, 1.5 l/min, 100 cc/min and 500 cc/minn, respectively, for 5 min, to form the I layer 64 comprising I-type GaN into a 1.0 μm thickness. Thus, single crystal I-type GaN 64 grew on the GaN exposing portion, but the conductive layer 65 comprising polycrystal GaN was formed above the SiO$_2$ layer 63. Then, the sapphire substrate 60 was taken out from the reaction compartment 20 and was cut in a predetermined form after aluminium electrodes 66, 67 were deposited on the I layer 64, to produce the light emitting diode. Thus, the electrode 66 functions as an electrode for the I layer 64, while the electrode 67 functions as an electrode for the N layer 62 through the conductive layer 65 and the extremely thin SiO$_2$ layer 63. By keeping the voltage of I-layer 64 positive to that of the N layer 62, light emitts form the junction face thereof.

The light emitting diode thus obtained has a 485 nm light emitting wave length and an 10 mcd optical density. The light emitting optical density of the present diode was improved by more than 10 times that of the AlN buffer layer formed in amorphous state.

We claim:

1. A substrate for growing a gallium nitride compound-semiconductor device (Al$_x$Ga$_{1-x}$N: X=0 inclusive), comprising:
   a sapphire substrate; and
   a buffer layer formed on said sapphire substrate, said buffer layer being formed by the metalorganic vapor phase epitaxy method (MOVPE) comprising growing a layer by flowing different kinds of organometallic gas in unturbulent state over the surface of said sapphire substrate and reacting said different kinds of organometallic gas near said surface of said substrate,
   said buffer layer being composed of aluminum nitride (AlN) showing a pattern mixed with a lattice pattern indicating single crystal and a halo pattern indicating amorphous state on the photographic image obtained by a reflective high energy electron diffraction method (RHEED), and being formed at a condition that the incident angle of said organometallic gas flow at the inlet side of said sapphire substrate against said surface of said sapphire substrate is in the range from 90° to 75°, and being formed in the state where said sapphire substrate is arranged inside a tube covering the upper surface of said substrate.

2. A substrate according to claim 1, wherein said buffer layer is formed in a thickness of 100 to 500Å.

3. A substrate according to claim 1, wherein said buffer layer is grown at a condition that the growing temperature is from a temperature of 380° C. or more to a temperature of less than 550° C.

4. A substrate according to claim 3, wherein said buffer layer is formed in a thickness of 100 to 500Å.

5. A substrate according to claim 1, wherein said interval between said tube and said surface of said sapphire substrate arranged inside of said tube gets narrow along the flowing direction of said organometallic gas.

6. A light emitting diode comprising:
   a sapphire substrate;
   a buffer layer formed on said sapphire substrate, said buffer layer being formed by a metalorganic vapor phase epitaxy method (MOVPE) comprising growing a layer by flowing different kinds of organometallic gas in unturbulent state over the surface of said sapphire substrate and reacting said different kinds of organometallic gas near said surface of said substrate,
   said buffer layer being composed of aluminum nitride (AlN) showing a pattern mixed with a lattice pattern indicating single crystal and a halo pattern indicating amorphous state on the photographic image obtained by a reflective high energy electron diffraction method (RHEED), and being formed at a condition that the incident angle of said organometallic gas flow at the inlet side of said sapphire substrate against said surface of said sapphire substrate is in the range from 90° to 75°, and being formed in the state where said sapphire substrate is arranged inside of a tube covering the upper surface of said substrate; and
   a layer for emitting light comprising gallium nitride compound-semiconductor (Al$_x$Ga$_{1-x}$N; X=0 inclusive) formed on said buffer layer.

7. A light emitting diode according to claim 6, wherein said buffer layer is formed in a thickness of 100 to 500Å.

8. A light emitting diode according to claim 6, wherein said buffer layer is grown at a condition that the growing temperature is from a temperature of 380° C. or more to a temperature of less than 800° C.

9. A light emitting diode according to claim 8, wherein said buffer layer is formed in a thickness of 100 to 500Å.

10. A light emitting diode according to claim 6, wherein said interval between said tube and said face of said sapphire substrate arranged inside of said tube gets narrow along the flowing direction of said organometallic gas.

* * * * *